United States Patent
Mallinson et al.

(10) Patent No.: US 7,782,129 B2
(45) Date of Patent: Aug. 24, 2010

(54) SYSTEM AND METHOD TO REDUCE AUDIO ARTIFACTS FROM AN AUDIO SIGNAL BY REDUCING THE ORDER OF THE CONTROL LOOP

(75) Inventors: Andrew Martin Mallinson, Kelowna (CA); Dustin Forman, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 1090 days.

(21) Appl. No.: 11/479,394

(22) Filed: Jun. 30, 2006

(65) Prior Publication Data
US 2008/0005214 A1    Jan. 3, 2008

(51) Int. Cl.
*H03F 3/38*    (2006.01)
*H03F 3/217*   (2006.01)
*H03F 3/00*    (2006.01)

(52) U.S. Cl. .......................... 330/10; 330/251; 330/146; 381/94.5; 381/111; 381/120; 332/109; 341/143; 375/238

(58) Field of Classification Search ................ 381/94.1, 381/94.5, 111, 120, 121; 330/10, 146, 251; 332/109; 341/143; 375/238
See application file for complete search history.

(56) References Cited

U.S. PATENT DOCUMENTS

| | | | | |
|---|---|---|---|---|
| 5,075,634 | A   * | 12/1991 | French   | 330/146 |
| 2002/0105450 | A1 * | 8/2002 | Delano | 341/143 |
| 2006/0187099 | A1 * | 8/2006 | Fujimoto | 341/143 |
| 2006/0226904 | A1 * | 10/2006 | Nalbant | 330/251 |
| 2007/0057720 | A1 * | 3/2007 | Hand et al. | 330/10 |
| 2009/0066549 | A1 * | 3/2009 | Thomsen et al. | 341/143 |
| 2009/0179709 | A1 * | 7/2009 | Zhu et al. | 332/109 |

* cited by examiner

*Primary Examiner*—Vivian Chin
*Assistant Examiner*—Friedrich Fahnert
(74) *Attorney, Agent, or Firm*—Kenta Suzue; Haynes Beffel & Wolfeld LLP

(57) ABSTRACT

A system is provided for use in an audio signal processor to reduce the order of the loop to remove sound artifacts from an audio signal that includes an input for receiving an audio input signal a control loop of order greater than one configured to process the audio input signal and to output a Pulse Width Modulated audio output signal, a circuit for performing a gradual reduction of the order of the control loop such that prior to entering a shut down state the order is reduced to a single order and a circuit to disconnect a Driver Circuit from the Pulse Width modulated signal operated by a timing device designed to switch at the moment of zero average output value.

2 Claims, 2 Drawing Sheets

Output active representing zero — Output disconnected

The output "dithers" the output transitions are not regular

SYSTEM AND METHOD TO REDUCE AUDIO ARTIFACTS FROM AN AUDIO SIGNAL BY REDUCING THE ORDER OF THE CONTROL LOOP

BACKGROUND

In high end audio circuit applications, high quality signal processing is essential for quality sound. Since high quality audio systems are indeed sensitive by their nature, sound artifacts or unwanted noise are more apparent when they occur. For example, it has been observed that artifacts can occur when a zero audio signal is present. This occurs because the value of the signal is not precisely zero. The reason it may not be precisely zero because of induced noise, electrical interference or any other phenomena that introduces unwanted noise. A particular example of such unwanted noise can occur when a multi-disk CD player changes disks. Here, the audio content is zero when the changer is removing one disk and inserting another, but electrical noise is created by the servo motor operation within the CD changer can induce unwanted noise into the audio output.

In a certain classes of audio equipment, such as Class D power amplifiers, this residual and undesirable noise occurs when the audio content is zero, and can be completely removed because it is possible to "switch off" the audio output. For example, when representing a zero audio signal, a Class D power amplifier may be constantly switching the output from a high value (of say 30 v) to a low value (of say −30 v) with approximately equal time spent at each value. Therefore, the average value is half way for example zero volts. To achieve complete silence in the output, such a Class D amplifier may simply cease to switch the signal at all, thus leaving the output to the speakers unconnected and perfectly silent. Typically, therefore, to exploit this possibility, a Class D audio system will have a means to detect zero audio signals, and upon detecting this condition, will cause the Class D output to shut off completely, achieving essentially perfect silence in the loudspeakers. However, it has been observed that the transition from operation with zero audio signals to operation with the output disconnected is not itself free from noise. That is, upon the appearance of zero signals in the audio data, the Class D output falls silent. This is because the output, while still operating, is creating the average zero value. The means to detect zero signals in the audio data will, after a short delay, conclude that the output should now switch off in order to achieve complete silence. When this means activates, the Class D output stage will transition from representing silence as the average signal value of zero (perhaps not completely silently due to the discussed artifacts) to representing silence because the output is switched off or disconnected (now representing complete silence since the output is no longer active). It is observed that this transition itself can be a source of noise (a click is typically heard). Fundamentally, the source of this noise as the system switches from an average value of no signal to a disconnected state is due to the detailed nature of the switching signal while the system is operating.

Specifically, the representation of silence as an average of non-zero output values, +30 v and −30 v for example, is achieved because the output spends equal time at the high value as at the low value—hence the average output is half way, zero volts in this example. Any such averaging process implies a time over which the signal is averaged. For example, if the output signal value has, for the last 10 uS, been at the high value, it will next spend 10 uS at the low value, such that, over the combined interval, 20 us in this example, the average value is mid way, zero volts. Thus, a time over which an average value is zero is a necessary part of the representation of zero when the system is active. This leads to the problem that the click artifact is heard in the transition from the operation with the average value to the operation with the output disconnected, because the act of switching to the disconnected condition truncates the averaging process such that the average value, at the moment of disconnection, may not be zero. As a result, a click will be heard when a Class D audio system attempts to transition from a representation of silence as an average value to a disconnected or non-operating state, because the average signal value at the moment of this transition may not be zero.

Therefore, there exists a need in the art for a system and method able to control the transition of a Class D audio system from operation with average switched values to operation with output disconnection such that no artifact (click) is induced at the moment of transition. As will be seen, the invention provides this in an elegant manner.

DETAILED DESCRIPTION

A high performance Class D audio system may be constructed with a sigma-delta modulator or other noise shaping control loop to quantize the audio signal in time such that an output suitable for connection to a Class D driver or bridge is created. A system is provided for use in an audio signal processor to reduce the order of the loop to remove sound artifacts from an audio signal that includes an input for receiving an audio input signal a control loop of order greater than one configured to process the audio input signal and to output a Pulse Width Modulated audio output signal, a circuit for performing a gradual reduction of the order of the control loop such that prior to entering a shut down state the order is reduced to a single order and a circuit to disconnect a Driver Circuit from the Pulse Width modulated signal operated by a timing device designed to switch at the moment of zero average output value.

The sigma delta modulator is a filter that transforms a hand-limited output signal into a digital 1-bit output signal, and the input signal modulates the output pulse density. This structure is intended as an example of one embodiment of the invention, and is not meant to limit the invention, which can extend to other filtering structures. It Will desirable to have this system implement an output "shut down" or disconnected state to achieve complete silence in the audio output with no noise artifacts. To achieve such a shut down of the output driver without making a "click," the moment of shut-down occurs when the average output value is zero.

Figure 1:
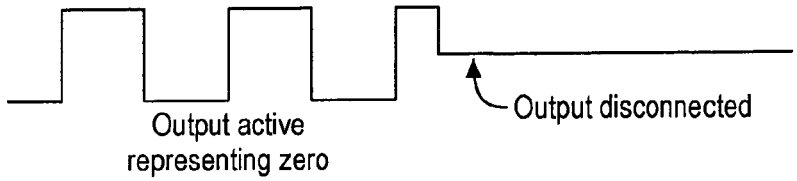
FIGS. 1 and 2 are illustrations of output signals characteristic of an output signal of a control loop.

There are some conditions when it is trivial to determine the moment when the output average value is zero. For example, if, when zero audio input is applied to the system, the output begins to create a 50:50 duty cycle, we know that an average value of zero exists half-way through the high or the low cycle. Referring to FIG. 1, a timing diagram illustrates a period of change from an output representing zero to a disconnected output. The pattern shown in FIG. A will not create a click or pop in the output. According to the invention the system can ensure that the output average value is zero at all points that are halfway through the high or the low cycle, and the output transition to disconnection can be timed such that it occurs at one of these halfway points.

Figure 2:
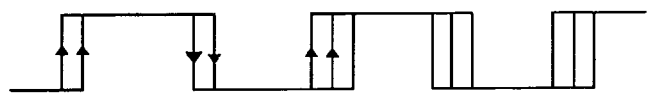

However, in general, zero audio input does not create a simple fixed 50:50 duty cycle in the output when the sigma delta modulator used has a high order. FIG. 2 shows a typical example of the output when zero audio data is applied at the input to a high order sigma delta modulator.

Because the output transitions are not regularly spaced in this illustration the point where the average is zero is not easily determined. In the case where a first order modulator is used, the outputs are fixed for zero input signal and repeat regularly thus FIG. 1 applies. In the case where the loop order is higher than one the outputs do not create a simple repeating pattern: FIG. B applies.

It is desirable to have a high order modulator in the Class D circuit to reduce noise and improve total harmonic Distortion. However, these high order modulators are not easily shut down due to the non-trivial calculation needed to find the point where the output average value is zero. The invention is directed to a means to get the benefit of the high order noise shaping while the loop is operating normally, but then switch to a first order modulator when the signal is a zero in order to take advantage of the fact that the output is then a fixed repeating pattern that is more easily shut down.

Figure 3:
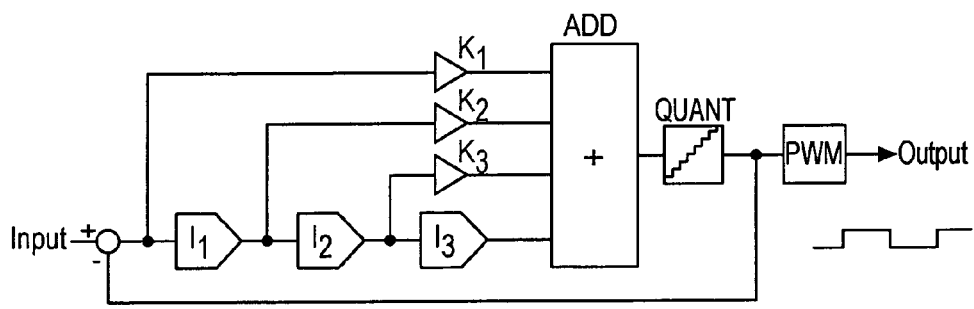
FIG. 3 is an illustration of a circuit for filtering an input signal.

Referring to FIG. 3, a third order sigma delta control loop (noise shaping loop) is shown. The elements I1, I2, I3 are integrators, the elements K1, K2 K3 are multipliers, ADD is an adder and QUANT is a quantizer. All of these components are well-known in the art. The terms [K=?] are designed to ensure stability of the loop. The input parameter (applied at the wire labeled "input") is, by this loop, quantized and noise shaped, generating an output from the quantizer that is fed back around the loop and also output to a means to convert the output into a Pulse Width Modulation signal. By this means, one method of converting a signal expressed over as many as 24 bits in the input into a two valued time domain signal suitable for connection to a Class D bridge chip at the output. The invention is directed to a higher than one order noise shaping loop. In this example it is a third order loop.

Figure 4:
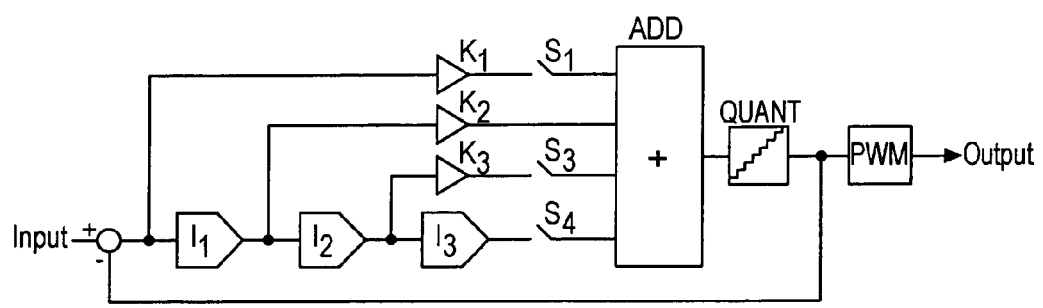
FIG. 4 is an illustration of a circuit for filtering an input signal.

FIG. 4 illustrates on embodiment of the invention. The existence of a means to remove the terms from the higher order integrators from the loop characterizesone embodiment of the invention: FIG. 4 illustrates simple switches S1, S3 and S4, that operates to connect each integrator via stabilizers Ki. With S1, S3 and S4 closed, the loop is the same as that of the prior art shown in FIG. 3. Upon opening the switch S4, which is taken to indicate that the signal from I3 is no longer available to the adder—it has been replaced with zero—the loop now becomes a second order loop. Upon opening the switch S3, the second integrator no longer contributes to the adder. The loop has thus become a first order loop. The switch S1 can now be opened and the loop will remain stable. In detail, the existence of the path through K1 and the switch S1 is illustrated to show that the presence of this "zero order" feed forward path, which is sometimes necessary to stabilize a high order loop, is not an impediment to the invention—it may be switched out at the conclusion of the switching sequence, leaving only the first integrator connected. It is the intention of this invention that the process of removing the higher order terms from the loop be undertaken when the input data (the audio data) is silent. As a result, the action of reducing the loop order has minimal impact on noise and THD. The is directed to the problem that results from a click free ("pop" free) shutdown of the output bridge may be resolved by first reducing the order of the loop. This will cause the output pattern to go to a repeating pattern, which can then be switched off half way through the high or the low cycle.

Figure 5:
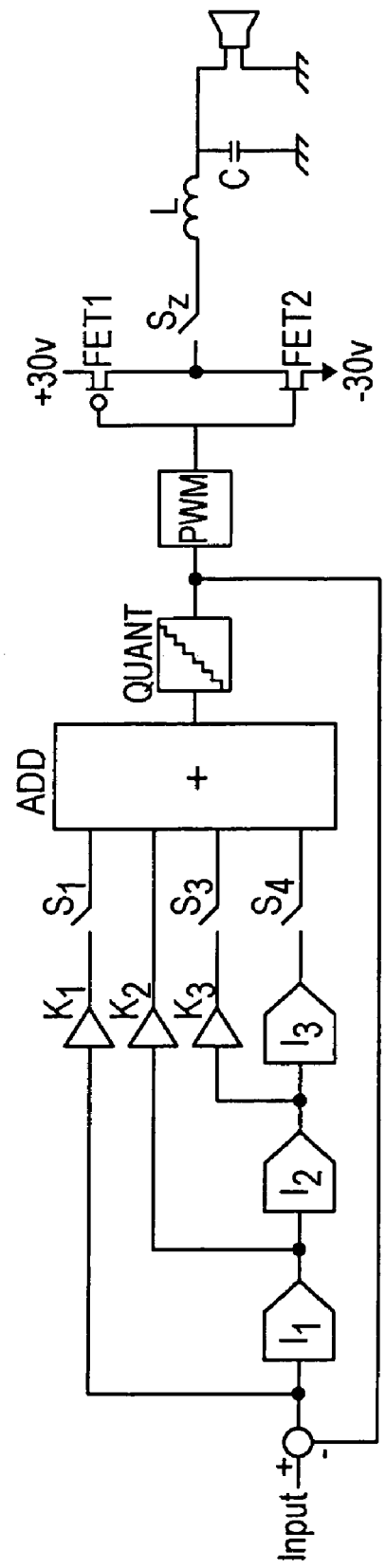
FIG. 5 is an illustration of a circuit for filtering an input signal according to the invention.

FIG. 5 illustrates a more detailed embodiment of the invention. And, the operation of the embodiment of FIG. 5 is as follows. To shut down the output and enter the silent state with no click or pop:

1) Audio Content is Detected as Zero—goto 2
2) Open Switch S4—goto 3
3) Wait 10 mS—goto 4
4) Open Switch S3—goto 5
5) Wait 10 mS—goto 6
6) Open Switch S1—goto 7
7) Wait for next rising edge on the PWM output—goto 8
8) Wait for one quarter of the interval between positive edges of PWM output—goto 9
9) Open Switch SZ—end.

To return from the silent state to the active state:

1) Wait for a positive edge on the PWM output—goto 2
2) Wait for one quarter of the interval between positive edges of PWM output—goto 3
3) Close the Switch SZ—goto 4
4) Close S1—goto 5
5) Wait 10 m—goto 6
6) Close S3—goto 7
7) Wait 10 mS—goto 8
8) Close S4—goto 9
9) Apply new non-zero audio data at the input—end The invention has been described in the context of a system and method of removing artifacts from an audio signal during shutdown of the output. However, the embodiments described herein are not intended as limiting of the spirit and scope of the invention, which is defined by the appended claims.

The invention claimed is:

1. A system for use in an audio signal processor to reduce the order of the loop to remove sound artifacts from an audio signal, comprising:
   an input for receiving an audio input signal;
   a control loop of order greater than one configured to process the audio input signal and to output a Pulse Width Modulated audio output signal;
   a means for the gradual reduction of the order of the control loop such that prior to entering a shut down state the order is reduced to a single order;
   a means to disconnected a Driver Circuit from the Pulse Width modulated signal operated by a timing device designed to switch at the moment of zero average output value.

2. A system according to claim 1, wherein the control loop is a sigma delta loop having a sigma delta modulator configured to receive an input audio signal summed together with a feedback signal, a pulse wave modulator configured to modulate the output of the sigma delta modulator and to generate a modulated output.

* * * * *